United States Patent [19]
Kawai

[11] Patent Number: 5,877,036
[45] Date of Patent: Mar. 2, 1999

[54] OVERLAY MEASURING METHOD USING CORRELATION FUNCTION

[75] Inventor: Kenji Kawai, Tokyo, Japan

[73] Assignee: NEC Corporation, Tokyo, Japan

[21] Appl. No.: 806,983

[22] Filed: Feb. 26, 1997

[30] Foreign Application Priority Data

Feb. 29, 1996 [JP] Japan ..................................... 8-043586

[51] Int. Cl.⁶ .......................... H01L 21/66; H01L 21/76; G01R 31/26; G03B 27/42
[52] U.S. Cl. ................................ 438/16; 438/401; 355/53
[58] Field of Search ....................... 438/16, 401; 355/53; 356/399, 400, 401

[56] References Cited

U.S. PATENT DOCUMENTS

| | | |
|---|---|---|
| 4,441,206 | 4/1984 | Kuniyoshi et al. . |
| 4,679,942 | 7/1987 | Suwa et al. . |
| 5,438,413 | 8/1995 | Mazor et al. ............................ 356/400 |
| 5,468,580 | 11/1995 | Tanaka ..................................... 355/53 |
| 5,493,403 | 2/1996 | Nishi . |
| 5,543,921 | 8/1996 | Uzawa et al. . |

FOREIGN PATENT DOCUMENTS

| | | |
|---|---|---|
| A 0163199 | 5/1985 | European Pat. Off. . |
| A 0444450 | 2/1991 | European Pat. Off. . |

OTHER PUBLICATIONS

"Various Detecting Algorithms", Rev. 001, Nov., 1995 with English translation.

*Primary Examiner*—Brian Dutton
*Attorney, Agent, or Firm*—Sughrue, Mion, Zinn, Macpeak & Seas, PLLC

[57] ABSTRACT

In a method of manufacturing a semiconductor integrated circuit device, a resist pattern is formed on a lower layer pattern of a semiconductor substrate using a mask. An image signal along a line extending on the lower layer pattern and the resist pattern is generated by an optical system. Based on the image signal, a center position of the resist pattern and a center position of the lower layer pattern are calculated using correlation calculation and an overlay error of the resist pattern to the lower layer pattern is determined. When the overlay error falls within a predetermined range, a next manufacturing process such as an etching process and an ion implantation process to the semiconductor substrate is executed. When the overlay error does not fall within a predetermined range, the resist pattern is removed, and a relative position between the semiconductor substrate and the mask is adjusted. Thereafter, the above steps are repeated.

20 Claims, 7 Drawing Sheets

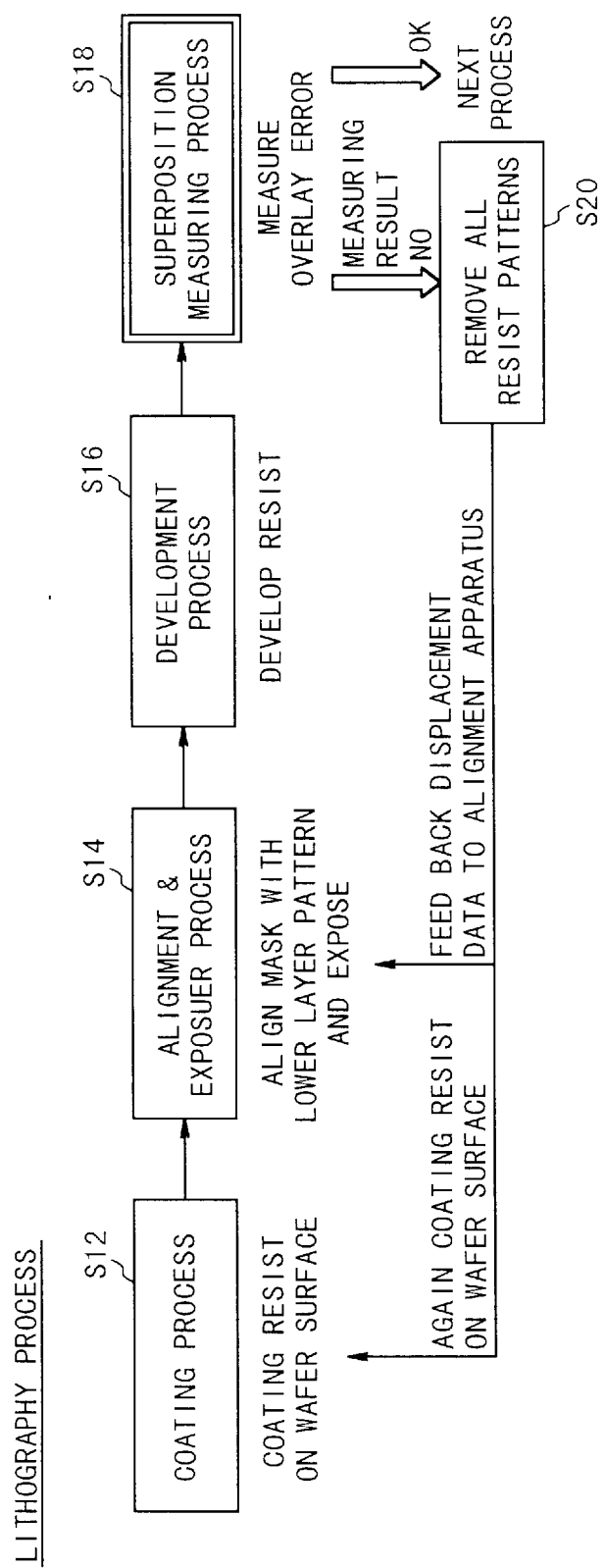

⇒ OVERLAY ERROR (Cr−Ca)

LOWER LAYER
PATTERN CENTER

PHOTO-RESIST
PATTERN CENTER

OVERLAY ERROR
(Cr-Ca)

OVERLAY MEASURING METHOD USING CORRELATION FUNCTION

BACKGROUND OF THE INVENTION

1. Field of the Invention

The present invention relates to an overlay measuring method in manufacturing a semiconductor integrated circuit, and more particularly to a method of measuring an overlay error of a photo-resist pattern which is formed in a photo-lithography process to a lower layer pattern.

2. Description of Related Art

FIGS. 1A to 1C are diagrams illustrating a conventional method of measuring an overlay error of a photo-resist pattern 11 to a lower layer pattern 12-1. FIG. 1A is a cross sectional view of a portion of a semiconductor integrated circuit in which the photo-resist pattern 11 is formed on a lower layer pattern 12-1. FIG. 1B is a diagram illustrating an optical image of the semiconductor integrated circuit portion and FIG. 1C is a diagram indicative of an image signal along a line A–A' of the optical image shown in FIG. 1B. In this example, the cross sectional shape of the lower layer pattern 12-1 is symmetrical.

In the conventional overlay measuring method, in a case where the semiconductor integrated circuit has the structure composed of the photo-resist pattern 11 and a lower layer pattern 12-1 in a photo-lithography process during manufacture of the semiconductor integrated circuit as shown in FIG. 1A, the image signal along the line A–A' of the optical image shown in FIG. 1B is extracted as shown in FIG. 1C. Because the contrast is dull at the edge positions of the lower layer pattern 12-2 and the edge portions of the photo-resist pattern 11, the image signal which is extracted in this way has four recess portions corresponding to the respective edges portions, as shown in FIG. 1C. The distances between the pattern edges can be determined from the positions of these recess portions.

In the case of FIG. 1A in which the lower layer pattern 12-1 is symmetrical, suppose that a distance between the edge on the left side of the lower layer pattern 12-1 and the edge on the left side of the photo-resist pattern 11 is "L1" and a distance between the edge on the right side of the photo-resist pattern 11 and the edge on the right side of the lower layer pattern 12-1 is "M1", as shown in FIG. 1C, the overlay error "G" of the photo-resist pattern 11 to the lower layer pattern 12-1 can be represented by the following equation (1).

$$G = (L1 - M1)/2 \qquad (1)$$

By the way, in the conventional overlay measuring method, the edge positions are calculated using algorithms such as a "least squares method", a "threshold method", and a "steep point method". Referring to FIG. 3A, the "least squares method" is a method in which each of the recess portions of the image signal is approximated by a secondary curve, and a position having a minimal value in the secondary curve is set as a "recess portion". Thus, the position is defined as the edge position, as shown in FIG. 3A.

The "threshold method" is a method in which after the difference between the maximum value and minimum value of the image signal is set to be "1", the image signal is sliced with a line having a predetermined ratio from the minimum value. The intersection points of the image signal and the line are defined as the edge positions, as shown in FIG. 3B.

The "steep point method" is a method in which primary differentiation is performed to the image signal and then the position having the maximum value in one recess portion and the position having the minimum value in another recess portion are defined as the edge positions, as shown in FIG. 3C.

All the above algorithms are devised that the overlay pattern is symmetrical. Therefore, if a symmetrical pattern is measured such as the photo-resist pattern and the pattern when a film is formed in a diffusion furnace, the correct measurement with less error can be performed.

However, if an asymmetrical pattern is measured such as a pattern when a film is formed by a sputtering apparatus, a shift component to either of a left direction and a right direction is superposed on the measuring result so that the measurement error becomes large. Thus, there is a problem in that it becomes not possible to perform an exact overlay measurement.

In this manner, in the conventional overlay measuring method, there is the problem that the measurement error becomes large in the overlay measurement, depending on the forming process of the lower layer pattern. This is because the image signal is also asymmetric at the edge sections on the left and right sides when the lower layer pattern is asymmetric in shape. As the result of this, in the method of calculating the edge positions using one of the above conventional algorithms, the shift component is superposed on the left or right side depending on an asymmetric extent.

The problems of the above conventional overlay measuring method will be further described with reference to FIGS. 2A to 2C. FIGS. 2A to 2C are diagrams illustrating the method of measuring an overlay error of the photo-resist pattern to the lower layer pattern when the lower layer pattern has asymmetric edge portions. FIG. 2A is a cross sectional view of such a semiconductor integrated circuit device in which a photo-resist pattern 11 is formed on a lower layer pattern 12-2, FIG. 2B is an optical image of the semiconductor integrated circuit device, and FIG. 2C is a diagram indicative of an image signal along a line B–B'.

As shown in FIG. 2A, the shape of the lower layer pattern 12-2 has asymmetric left and right edge portions. For this reason, both of the optical image and the image signal have also asymmetric left and right edge portions, as shown in FIGS. 2B and 2C. As a result, a measurement error is generated compared to the above case of FIGS. 1A to 1C in which the lower layer pattern 12-2 has a symmetrical shape at the left and right edge portions. In FIG. 2C, L2 indicates a distance between the edge on the left side of the lower layer pattern 12-2 and the edge on the left side of the photo-resist pattern 11 and M2 indicates a distance between the edge on the right side of the photo-resist pattern 11 and the edge on the right side of the lower layer pattern 12-2.

SUMMARY OF THE INVENTION

The present invention is made in consideration of the above conventional problems, and has as an object to provide an overlay measuring method in which the measurement error is small so that correct overlay measurement can be performed even if, for example, a lower layer pattern has an asymmetric shape based on the process of forming the lower layer pattern as shown in the above FIG. 2A.

In order to achieve an aspect of the present invention, in a method of manufacturing a semiconductor integrated circuit device, a resist pattern is formed on a lower layer pattern of a semiconductor substrate using a mask. An image signal is generated along a line extending on the lower layer pattern and the resist pattern and an overlay error of the resist pattern to the lower layer pattern is calculated from the image signal using correlation calculation. When the overlay error falls within a predetermined range, a next manufacturing process such as an etching process and an ion implantation process to the semiconductor substrate is executed. When the overlay error does not fall within a predetermined range, the resist pattern is removed, the semiconductor substrate and the mask are relatively moved or an optical system is adjusted, based on the overlay error, and the step of forming a resist pattern, the step of generating an image signal and the step of calculating an overlay error of the resist pattern are repeated.

The calculation may be executed by calculating a center position of the lower layer pattern using the correlation calculation based on a first signal portion of the image signal indicative of edge portions of the lower layer pattern, calculating a center position of the resist pattern from a second signal portion of the image signal indicative of edge portions of the resist pattern, and calculating the overlay error from the center position of the lower layer pattern and the center position of the resist pattern.

In this case, the calculation of the center position of the lower layer pattern may be performed by generating new waveform portions having the same shapes as waveform portions corresponding to the edge portions of the lower layer pattern on positions moved in directions opposite to each other by a same distance with respect to positions of the waveform portions corresponding to the edge portions of the lower layer pattern, synthesizing the generated new waveform portions and the first signal portion to produce a synthesized signal, and performing the correlation calculation to the synthesized signal to calculate the center position of the lower layer pattern.

Alternatively, the calculation of the center position of the lower layer pattern may be performed by performing the correlation calculation to the lower layer pattern signal to calculate the center position of the lower layer pattern without generating any new waveform portions when a similarity between waveform portions corresponding to edge portions of the lower layer pattern is higher than a predetermined level.

Further alternatively, the calculation of the center position of the lower layer pattern may be performed by determining whether a similarity of waveform portions of the image signal corresponding to the edge portions of the lower layer pattern is lower than a predetermined level, generating new waveform portions having the same shapes as the waveform portions corresponding to the edge portions of the lower layer pattern on positions moved in directions opposite to each other by a same distance with respect to positions of the waveform portions corresponding to the edge portions of the lower layer pattern, when it is determined that the similarity of the waveform portions corresponding to the edge portions of the lower layer pattern is lower than the predetermined level, synthesizing the generated new waveform portions and the first signal portion to produce a synthesized signal, and performing the correlation calculation to the synthesized signal to calculate the center position of the lower layer pattern.

Still further alternatively, the correlation calculation may be performed by separating a lower layer pattern signal and a resist pattern signal from the image signal, calculating a center position of the lower layer pattern from the lower layer pattern signal using the correlation calculation, calculating a center position of the resist pattern from the resist pattern signal, and calculating the overlay error from the center position of the lower layer pattern and the center position of the resist pattern.

In order to achieve another aspect of the present invention, in a method of manufacturing a semiconductor integrated circuit device, a resist pattern is formed on a lower layer pattern of a semiconductor substrate using a mask, an image signal is generated along a line extending on the lower layer pattern and the resist pattern, a center position of the resist pattern and a center position of the lower layer pattern are calculated using correlation calculation based on the image signal to determine an overlay error of the resist pattern to the lower layer pattern, and a next manufacturing process such as an etching process and an ion implantation process to the semiconductor substrate is executed when the overlay error falls within a predetermined range.

BRIEF DESCRIPTION OF THE DRAWINGS

FIGS. 1A to 1C are diagrams illustrating a conventional overlay measuring method when a lower layer pattern is symmetrical, wherein FIG. 1A is a cross sectional view of a lower layer pattern on which a photo-resist pattern is formed, FIG. 1B is an optical image of the lower layer pattern, and FIG. 1C is an image signal along the line A–A' in the optical image shown in FIG. 1B;

FIGS. 2A to 2C are diagrams illustrating a conventional overlay measuring method when a lower layer pattern is asymmetrical, wherein FIG. 2A is a cross sectional view of a lower layer pattern on which a photo-resist pattern is formed, FIG. 2B is an optical image of the lower layer pattern, and FIG. 2C is an image signal along the line B–B' in the optical image shown in FIG. 2B;

FIGS. 3A to 3C are diagrams to explain various techniques used in the conventional overlay measuring method, wherein FIG. 3A is a diagram illustrating a least squares method, FIG. 3B is a diagram illustrating a threshold method, and FIG. 3C is a diagram illustrating a steep point method;

FIG. 5 is a diagram illustrating a lithography process used in the process of manufacturing a semiconductor device;

FIGS. 6A to 6H are diagrams illustrating an overlay measuring method according to the first embodiment of the present invention, wherein: FIG. 6A is a pattern cross sectional view of a semiconductor substrate in which a photo-resist pattern is positioned on a lower layer pattern; FIG. 6B is an optical picture of a portion of the semiconductor substrate; FIG. 6C is an image signal along the line C–C' in the optical image shown in FIG. 6B; FIG. 6D is an image signal corresponding to only the lower layer pattern; FIG. 6E is an image signal synthesized from the image signal shown in FIG. 6D and an image signal generated from the image signal shown in FIG. 6C; FIG. 6F is a diagram illustrating a correlation calculation result; FIG. 6G is an image signal corresponding to the photo-resist pattern, and FIG. 6H is a diagram illustrating the center of the photo-resist pattern; and FIGS. 7A to 7F are diagrams illustrating an overlay measuring method according to the second embodiment of the present invention, wherein FIG. 7A is a pattern cross sectional view of a semiconductor substrate in which a photo-resist pattern is positioned on a lower layer pattern; FIG. 7B is an image signal when the lower layer pattern and the photo-resist pattern are scanned; FIG. 7C is an image signal corresponding to only the lower layer pattern; FIG. 7D is a diagram illustrating a correlation calculation result; FIG. 7E is an image signal corresponding to the photo-resist pattern; and FIG. 7F is a diagram illustrating the center of the photo-resist pattern.

DESCRIPTION OF THE PREFERRED EMBODIMENTS

Figure 4:
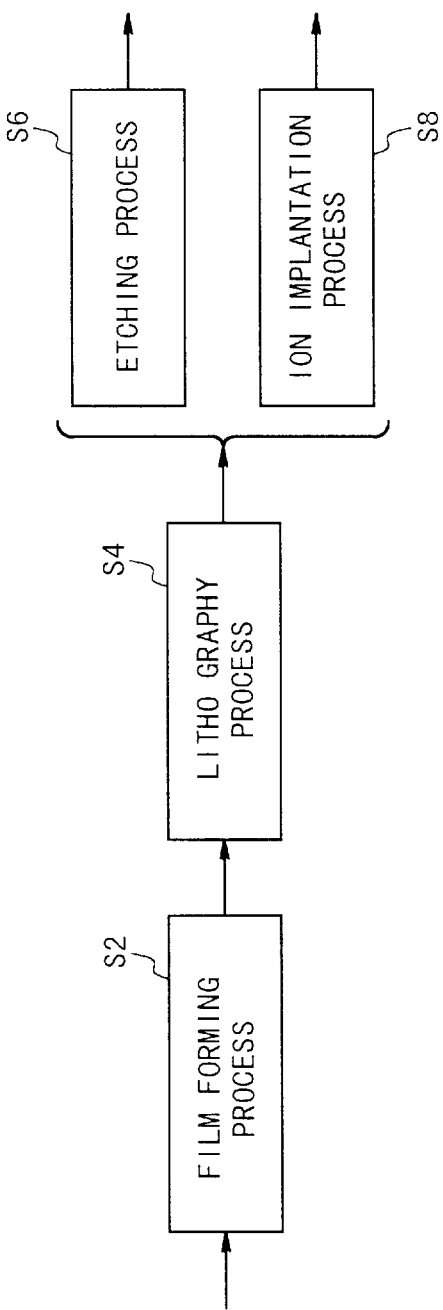
FIG. 4 is a diagram illustrating a part of the process of manufacturing a semiconductor device.

Next, a semiconductor device manufacturing method of the present invention will be described in detail with reference to the accompanying drawings. FIG. 4 is a flow diagram illustrating a part of the semiconductor device manufacturing method. Referring to FIG. 4, a film is formed on a semiconductor substrate in a step S2. Then, a lithography process is executed in a step S4 to form a photo-resist pattern. Subsequently, an etching process in a step S6 or an ion implantation process in a step S8 is executed.

FIG. 5 is a flow diagram illustrating the detail of the lithography process of the step S4. Referring to FIG. 5, in the lithography process, a photo-resist film is coated on whole surface of the semiconductor substrate by a coating machine in a step S12. Subsequently, in a step S14, by a stepper unit, a mask is set and the semiconductor substrate is aligned with the mask and then the semiconductor substrate is exposed. Subsequently, in a step S16, the exposed portion of the photo-resist film is developed and an unnecessary portion of the photo-resist film is removed such that a pattern of the photo-resist film remains. In a step S18, an overlay measuring process according to the present invention is executed. In the overlay measuring process, an overlay error is measured for each of test points. The detail of the overlay measuring process will be described below. When all the overlay errors fall within a predetermined range, the semiconductor substrate is subjected to the next process such as the etching process (step S6) and the ion implantation process (step S8). On the other hand, when all the overlay errors do not fall within the predetermined range, a process of a step S20 is executed. In the step S20, all the photo-resist patterns are removed. At the same time, data indicative of the overlay displacements and data indicative of the position of the test points are sent to the stepper unit. The semiconductor substrate is transferred to the coating machine again such that the above-mentioned processes are repeated. In this case, in the step S14, the stepper unit moves the position of the semiconductor substrate based on the overlay displacement data and the test point position data such that the semiconductor substrate and the mask are relatively adjusted. Or, the stepper unit automatically adjusts an optical system.

Figure 6A:
Figure 6B:
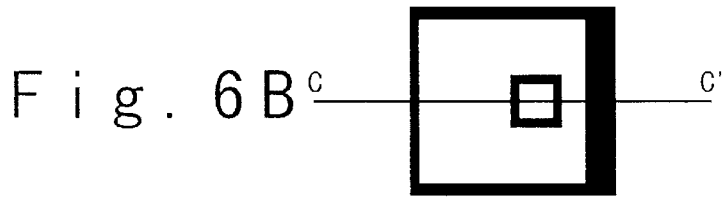
Figure 6C:

FIGS. 6A to 6H are diagrams illustrating the above-mentioned overlay measuring process. Referring to FIG. 6A, the semiconductor substrate has the structure in which the photo-resist pattern 1 is formed on a lower layer pattern 2. This lower layer pattern 2 is a box mark for a special purpose and has a concave portion. The structure is observed by a CCD and an optical image is obtained as shown in FIG. 6B. At this time, an image signal Y(I) along a line C–C' of the optical image shown in FIG. 6B is obtained as shown in FIG. 6C. The box mark used in this example has two inclined portions. One is steep and the other is gentle. In a case where such a box mark is used, the image signal has four recess portions, i.e., the first to fourth recess portion in correspondence to the left-hand side edge of the lower layer pattern 2, the left-hand side edge of the photo-resist pattern 1, the right-hand side edge of the photo-resist pattern 1, and the right-hand side edge of the lower layer pattern 1.

Figure 6D:
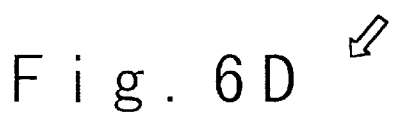
Figure 6G:
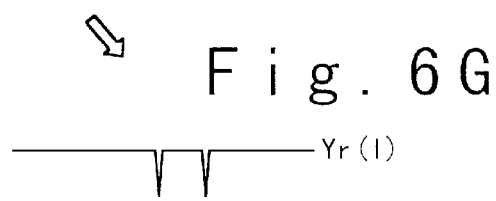

The image signal Y(I) is separated into an image signal Ya(I) shown in FIG. 6D and an image signal Yr(I) shown in FIG. 6G, based on the number of recess portions. That is, the first and fourth portions of the image signal Y(I) are extracted to the image signal Ya(I) and the second and third portions of the image signal Y(I) are extracted to the image signal Yr(I).

Figure 6E:
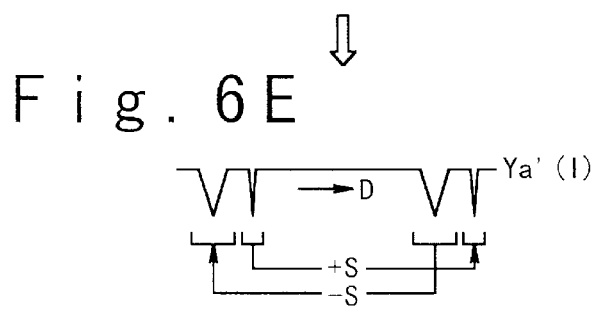

Next, a synthetic image signal Ya'(I) is formed as shown in FIG. 6E. More particularly, the wave form of the first recess portion is added to the image signal Ya(I) shown in FIG. 6D at the position shifted by a distance S in a direction shown by an arrow D from the position where the first recess portion is present. Further, the wave form of the fourth recess portion is added to the image signal Ya(I) shown in FIG. 6D at the position shifted by a distance S in a direction opposite to the direction shown by the arrow D from the position where the fourth recess portion is present. Thus, the synthetic image signal Ya'(I) is obtained.

Next, a correlation calculation is executed to the image signal Ya'(I) using the following equation (2).

$$Z(I) = \sum_{J=J_1}^{J_2} Ya'(I+J)Ya'(I-J) \quad (2)$$

While a parameter J is changed from J1 to J2, data in symmetric positions are multiplied and a summation of the data is calculated. As a result, a correlation calculation result signal Z(I) is obtained as shown in FIG. 6F. The position having the minimum value is a center position "Ca" of the lower layer pattern.

Figure 3A:
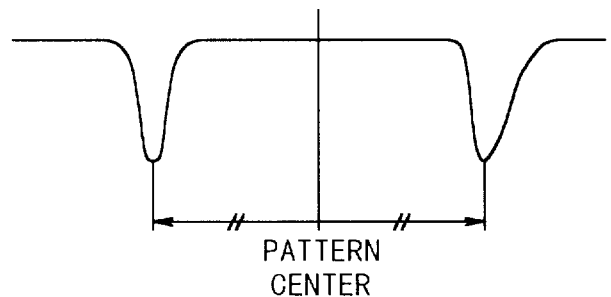
Figure 3B:
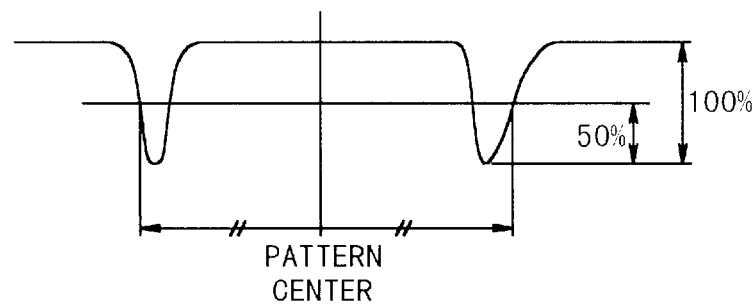
Figure 3C:
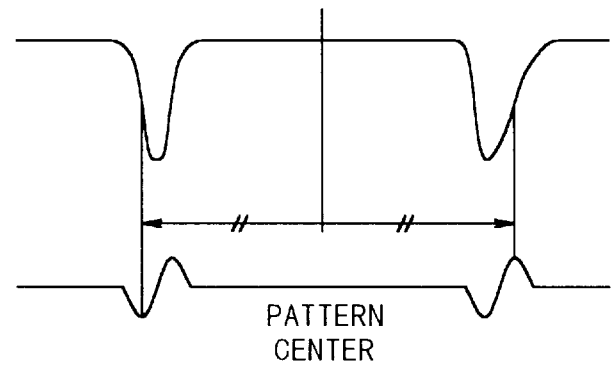
Figure 6H:
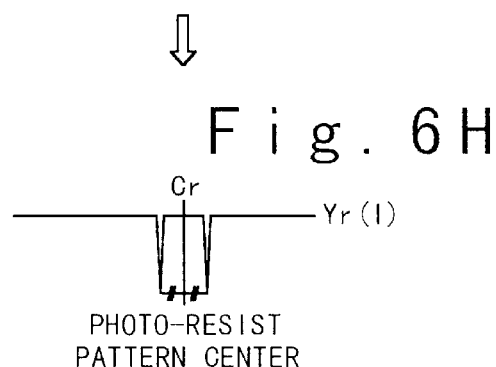
Figure 6F:
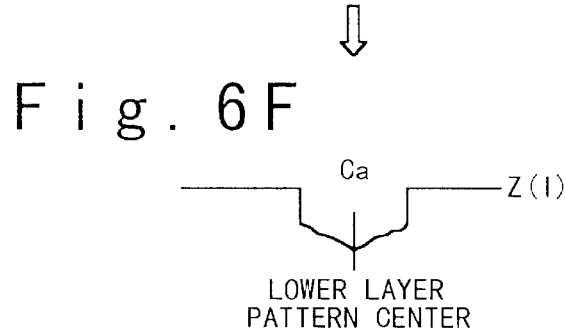

On the other hand, as shown in FIG. 6H, a center "Cr" of the photo-resist pattern 1 is determined using one of the methods of FIGS. 3A to 3C. Alternatively to determine the photo-resist pattern center "Cr", the correlation calculation may be used as shown in FIG. 6F.

Subsequently, the overlay error is determined from the lower layer pattern center "Ca" and the photo-resist pattern center "Cr", i.e., from an equation of (Cr–Ca).

Figure 1A:
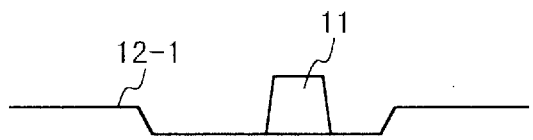
Figure 1B:
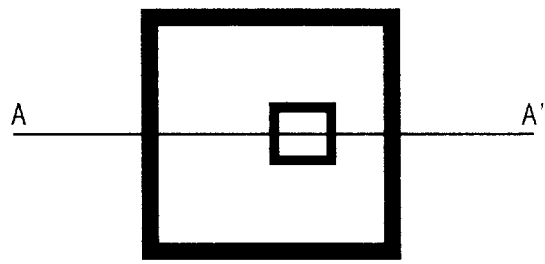
Figure 1C:
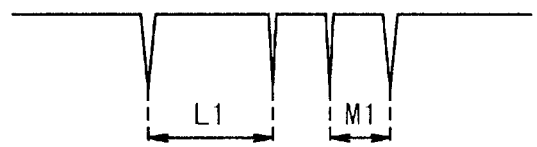
Figure 2A:
Figure 2B:
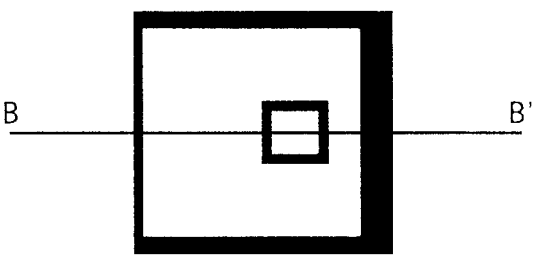
Figure 2C:
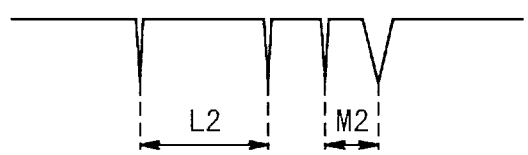

In a case where the shape of the lower layer pattern 2 becomes asymmetric, as shown in FIG. 2A, that is, in a case where the taper of the left-hand side edge portion of the lower layer pattern 12-2 is steep and the taper of the right-hand side edge section is gentle, the prior art result indicated that the lower layer pattern center was shifted to the left-hand side. In other words, measurement error is generated by this shift. On the other hand, in the overlay measuring method of the present invention, because the lower layer pattern center "Ca" is calculated using the correlation calculation after the image signal wave forms of either side edge portion are synthesized to the image signal Ya(I) at the opposing positions, the overlay measurement can be performed without influence of the asymmetrical shape and without containing the shift.

Figure 7A:
Figure 7B:

FIGS. 7A to 7F are diagrams illustrating the above-mentioned overlay measuring process according to the second embodiment of the present invention. Referring to FIG. 7A, the semiconductor substrate has the structure in which the photo-resist pattern 1 is formed on a lower layer pattern 2. This lower layer pattern 2 has two line marks for a special purpose. The structure is observed by a CCD and an optical image is obtained. At this time, an image signal Y(I) is obtained as shown in FIG. 7B. Each of the line marks used in this example is formed as a convex portion and has two inclined portions. One is steep and the other is gentle. The line mark may be formed as a concave portion. In a case where such line marks are used, the image signal has six recess portions, i.e., the first to sixth recess portion in correspondence to the left-hand side edges of the lower layer pattern 2, the left-hand side edge of the photo-resist pattern 1. the right-hand side edge of the photo-resist pattern 1, and the right-hand side edges of the lower layer pattern 2.

Figure 7C:
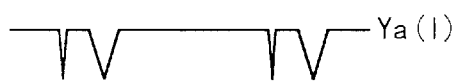
Figure 7E:
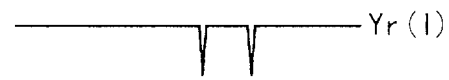

The image signal Y(I) is separated into an image signal Ya(I) shown in FIG. 7C and an image signal Yr(I) shown in FIG. 7E, based on the number of recess portions. That is, the first, second, fifth and sixth recess portions of the image signal Y(I) are extracted for the image signal Ya(I) and the third and fourth recess portions of the image signal Y(I) are extracted for the image signal Yr(I).

Figure 7D:
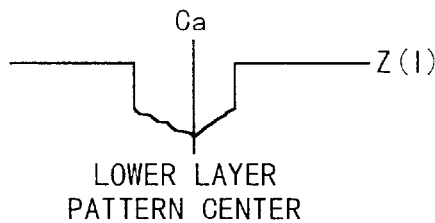

Next, a correlation calculation is executed to the image signal Ya(I) using an equation similar to the equation (2), as in the first embodiment. As a result, a correlation calculation result signal Z(I) is obtained as shown in FIG. 7D. The position having the minimum value is a center position "Ca" of the lower layer pattern.

Figure 7F:
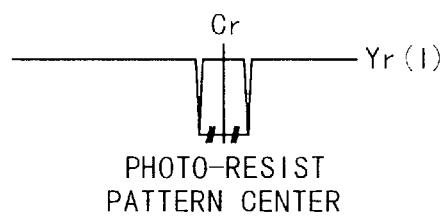

On the other hand, as shown in FIG. 7F, a center "Cr" of the photo-resist pattern 1 is determined using one of the methods of FIGS. 3A to 3C. Alternatively, to determine the photo-resist pattern center "Cr", the correlation calculation may be used as shown in FIG. 7D.

Subsequently, the overlay error is determined from the lower layer pattern center "Ca" and the photo-resist pattern center "Cr", i.e., from an equation of (Cr–Ca).

As described above, in the second embodiment, the two recess portions can be extracted from each of the convex portions (line marks). For this reason, even if the wave form synthesis is not performed unlike the first embodiment, the correlation calculation result can be obtained from the lower layer pattern image signal Ya(I).

In the above embodiments, the photo-resist pattern image signal Yr(I) and the lower layer pattern image signal Ya(I) are separated from the image signal Y(I). However, the overlay measuring method may be applied to the image signal Y(I) without the separation. Also, the separation is performed based on the number of recess portions. However, whether the wave forms at the edges of the lower layer pattern are similar may be determined. If the wave forms are similar, i.e., a similarity falls within a predetermined range, the lower layer pattern center is calculated as in the second embodiment, and if the wave forms are not similar, i.e., a similarity does not fall within a predetermined range, the lower layer pattern center is calculated as in the first embodiment, after the wave form synthesis is performed.

According to the present invention, in a case where the lower layer pattern is asymmetric, the correct overlay measurement can be performed without any overlay error due to the asymmetric shape.

Although the present invention was described in various embodiments, the present invention is not limited to the various embodiments.

What is claimed is:

1. A method of manufacturing a semiconductor integrated circuit device, comprising the steps of:
   forming a resist pattern on a lower layer pattern of a semiconductor substrate using a mask;
   generating an image signal along a line extending on said lower layer pattern and said resist pattern;
   calculating an overlay error of said resist pattern to said lower layer pattern from the image signal using a correlation calculation; and
   performing a next manufacturing process on said semiconductor substrate when said overlay error falls within a predetermined range, wherein said next manufacturing process is one of an etching process and an ion implantation process.

2. A method of manufacturing a semiconductor integrated circuit device according to claim 1, wherein said calculating step includes:
   calculating a center position of said lower layer pattern using the correlation calculation based on a first signal portion of said image signal indicative of edge portions of said lower layer pattern;
   calculating a center position of said resist pattern from a second signal portion of said image signal indicative of edge portions of said resist pattern; and
   calculating said overlay error from said center position of said lower layer pattern and said center position of said resist pattern.

3. A method of manufacturing a semiconductor integrated circuit device according to claim 2, wherein said step of calculating a center position of said lower layer pattern includes:
   generating new waveform portions having the same shapes as waveform portions corresponding to the edge portions of said lower layer pattern on positions moved in directions opposite to each other by a same distance with respect to positions of the waveform portions corresponding to the edge portions of said lower layer pattern;
   synthesizing the generated new waveform portions and said first signal portion to produce a synthesized signal; and
   performing the correlation calculation to the synthesized signal to calculate said center position of said lower layer pattern.

4. A method of manufacturing a semiconductor integrated circuit device according to claim 2, wherein said step of calculating a center position of said lower layer pattern includes:
   performing the correlation calculation to said lower layer pattern signal to calculate said center position of said lower layer pattern without generating any new waveform portions when the waveform portions corresponding to edge portions of said lower layer pattern are similar.

5. A method of manufacturing a semiconductor integrated circuit device according to claim 2, wherein said step of calculating a center position of said lower layer pattern includes:
   determining whether waveform portions of said image signal corresponding to the edge portions of said lower layer pattern are similar;
   generating new waveform portions having the same shapes as the waveform portions corresponding to the edge portions of said lower layer pattern on positions moved in directions opposite to each other by a same distance with respect to positions of the waveform portions corresponding to the edge portions of said lower layer pattern, when it is determined that the waveform portions corresponding to the edge portions of said lower layer pattern are not similar;
   synthesizing the generated new waveform portions and said first signal portion to produce a synthesized signal; and
   performing the correlation calculation on the synthesized signal to calculate said center position of said lower layer pattern.

6. A method of manufacturing a semiconductor integrated circuit device according to claim 5, wherein said step of calculating a center position of said lower layer pattern includes:
   performing the correlation calculation to said first signal portion to calculate said center position of said lower layer pattern without generating any new waveform portions when the waveform portions corresponding to edge portions of said lower layer pattern are similar.

7. A method of manufacturing a semiconductor integrated circuit device according to claim 1, wherein said calculating step includes:

separating a lower layer pattern signal and a resist pattern signal from said image signal;

calculating a center position of said lower layer pattern from said lower layer pattern signal using the correlation calculation;

calculating a center position of said resist pattern from said resist pattern signal; and calculating said overlay error from said center position of said lower layer pattern and said center position of said resist pattern.

8. A method of manufacturing a semiconductor integrated circuit device according to claim 7, wherein said step of calculating a center position of said lower layer pattern includes:

generating new waveform portions having the same shapes as waveform portions corresponding to edge portions of said lower layer pattern on positions moved in directions opposite to each other by a same distance with respect to positions of the waveform portions corresponding to the edge portions of said lower layer pattern, when the waveform portions corresponding to the edge portions of said lower layer pattern are not similar;

synthesizing the generated new waveform portions and said lower layer pattern signal to produce a synthesized signal; and performing the correlation calculation to the synthesized signal to calculate said center position of said lower layer pattern.

9. A method of manufacturing a semiconductor integrated circuit device according to claim 8, wherein said step of calculating a center position of said lower layer pattern includes:

performing the correlation calculation to said lower layer pattern signal to calculate said center position of said lower layer pattern without generating any new waveform portions when the waveform portions corresponding to edge portions of said lower layer pattern are similar.

10. A method of manufacturing a semiconductor integrated circuit device according to claim 1, further comprising the steps of:

removing said resist pattern when said overlay error does not fall within said predetermined range;

relatively moving said semiconductor substrate and said mask; and repeating said step of forming a resist pattern, said step of generating an image signal and said step of calculating an overlay error of said resist pattern.

11. A method of manufacturing a semiconductor integrated circuit device, comprising the steps of:

forming a resist pattern on a lower layer pattern of a semiconductor substrate using a mask;

generating an image signal along a line extending on said lower layer pattern and said resist pattern;

calculating a center position of said resist pattern and a center position of said lower layer pattern using a correlation calculation based on said image signal to determine an overlay error of said resist pattern to said lower layer pattern; and performing a next manufacturing process on said semiconductor substrate when said overlay error falls within a predetermined range, wherein said next manufacturing process is one of an etching process and an ion implantation process.

12. A method of manufacturing a semiconductor integrated circuit device according to claim 11, wherein said calculating step includes:

calculating a center position of said lower layer pattern using the correlation calculation based on a first signal portion of said image signal indicative of edge portions of said lower layer pattern;

calculating a center position of said resist pattern from a second signal portion of said image signal indicative of edge portions of said resist pattern; and calculating said overlay error from said center position of said lower layer pattern and said center position of said resist pattern.

13. A method of manufacturing a semiconductor integrated circuit device according to claim 12, wherein said step of calculating a center position of said lower layer pattern includes:

generating new waveform portions having the same shapes as waveform portions corresponding to the edge portions of said lower layer pattern on positions moved in directions opposite to each other by a same distance with respect to positions of the waveform portions corresponding to the edge portions of said lower layer pattern;

synthesizing the generated new waveform portions and said first signal portion to produce a synthesized signal; and performing the correlation calculation to the synthesized signal to calculate said center position of said lower layer pattern.

14. A method of manufacturing a semiconductor integrated circuit device according to claim 12, wherein said step of calculating a center position of said lower layer pattern includes:

performing the correlation calculation to said lower layer pattern signal to calculate said center position of said lower layer pattern without generating any new waveform portions when the waveform portions corresponding to edge portions of said lower layer pattern are similar.

15. A method of manufacturing a semiconductor integrated circuit device according to claim 12, wherein said step of calculating a center position of said lower layer pattern includes:

determining whether the waveform portions of said image signal corresponding to the edge portions of said lower layer pattern are similar;

generating new waveform portions having the same shapes as the waveform portions corresponding to the edge portions of said lower layer pattern on positions moved in directions opposite to each other by a same distance with respect to positions of the waveform portions corresponding to the edge portions of said lower layer pattern, when it is determined that the waveform portions corresponding to the edge portions of said lower layer pattern are not similar;

synthesizing the generated new waveform portions and said first signal portion to produce a synthesized signal; and performing the correlation calculation on the synthesized signal to calculate said center position of said lower layer pattern.

16. A method of manufacturing a semiconductor integrated circuit device according to claim 15, wherein said step of calculating a center position of said lower layer pattern includes:

performing the correlation calculation to said first signal portion to calculate said center position of said lower layer pattern without generating any new waveform portions when the waveform portions corresponding to edge portions of said lower layer pattern are similar.

17. A method of manufacturing a semiconductor integrated circuit device according to claim 11, wherein said calculating step includes:

separating a lower layer pattern signal and a resist pattern signal from said image signal;

calculating a center position of said lower layer pattern from said lower layer pattern signal using the correlation calculation;

calculating a center position of said resist pattern from said resist pattern signal; and calculating said overlay error from said center position of said lower layer pattern and said center position of said resist pattern.

18. A method of manufacturing a semiconductor integrated circuit device according to claim 17, wherein said step of calculating a center position of said lower layer pattern includes:

generating new waveform portions having the same shapes as waveform portions corresponding to edge portions of said lower layer pattern on positions moved in directions opposite to each other by a same distance with respect to positions of the waveform portions corresponding to the edge portions of said lower layer pattern, when the waveform portions corresponding to the edge portions of said lower layer pattern are not similar;

synthesizing the generated new waveform portions and said lower layer pattern signal to produce a synthesized signal; and performing the correlation calculation to the synthesized signal to calculate said center position of said lower layer pattern.

19. A method of manufacturing a semiconductor integrated circuit device according to claim 18, wherein said step of calculating a center position of said lower layer pattern includes:

performing the correlation calculation to said lower layer pattern signal to calculate said center position of said lower layer pattern without generating any new waveform portions when the waveform portions corresponding to edge portions of said lower layer pattern are similar.

20. A method of manufacturing a semiconductor integrated circuit device according to claim 11, further comprising the steps of:

removing said resist pattern when said overlay error does not fall within a predetermined range;

relatively moving said semiconductor substrate and said mask; and repeating said step of forming a resist pattern, said step of generating an image signal and said step of calculating an overlay error of said resist pattern.

* * * * *